(12) United States Patent
Wang et al.

(10) Patent No.: US 7,152,289 B2
(45) Date of Patent: Dec. 26, 2006

(54) METHOD FOR FORMING BULK RESONATORS SILICON <110> SUBSTRATE

(75) Inventors: Li-Peng Wang, Santa Clara, CA (US); Qing Ma, San Jose, CA (US); Israel Yankovich, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/254,402

(22) Filed: Sep. 25, 2002

(65) Prior Publication Data

US 2004/0056560 A1   Mar. 25, 2004

(51) Int. Cl.
*H04R 17/00* (2006.01)
*H01L 41/04* (2006.01)

(52) U.S. Cl. .......... 29/25.35; 29/594; 29/830; 29/831; 29/835; 29/846; 29/847; 310/311

(58) Field of Classification Search ........ 29/25.35, 29/830, 835, 831, 594, 846, 847, 852, 25.25; 310/311, 321, 322, 324, 366; 216/13, 83, 216/76, 77, 78
See application file for complete search history.

(56) References Cited

U.S. PATENT DOCUMENTS 4,348,609 A   9/1982   Inoue .................. 310/367
4,443,293 A   4/1984   Mallon et al. .......... 156/647
5,067,985 A * 11/1991  Carver et al. ............ 136/255

(Continued)

FOREIGN PATENT DOCUMENTS

| DE | 288032 A5 | 3/1991 |
| EP | 1073198 A2 | 1/2001 |
| EP | 1306973 A2 | 5/2003 |

OTHER PUBLICATIONS

Barycka, Irena, et al., "Silicon anisotropic etching in KOH-isopropanol etchant", *Sensors and Actuators A*, 48, Elseveier Science S.A., (1995), 229-238.

Krishnaswamy, S. V., et al., "Film Bulk Acoustic Wave Resonator and Filter Technology", *1992 IEEE MTT-S Digest*, (Jun. 1-5, 1995), 153-155.

(Continued)

*Primary Examiner*—A. Dexter Tugbang
*Assistant Examiner*—Tai Van Nguyen
(74) *Attorney, Agent, or Firm*—Schwegman, Lundberg, Woessner & Kluth, P.A.

(57) ABSTRACT

A method for forming a device on a substrate of <110> silicon includes forming a first conductive layer onto the substrate, and forming a piezoelectric layer on the first portion of a first conductive layer. A second electrode is formed on the piezoelectric layer, and a backside portion of the substrate under the piezoelectric layer and the first conductive layer is removed using a crystal orientated dependent etch.

18 Claims, 10 Drawing Sheets

U.S. PATENT DOCUMENTS 5,075,641 A * 12/1991 Weber et al. ............ 331/108 C
5,129,132 A * 7/1992 Zdeblick et al. ............ 29/25.35
5,185,589 A 2/1993 Krishnaswamy et al. ... 333/133
5,485,038 A * 1/1996 Licari et al. ................. 257/758
5,488,504 A * 1/1996 Worchesky et al. ......... 359/248
5,714,917 A * 2/1998 Ella ........................... 332/144
5,883,012 A 3/1999 Chiou et al. ................ 438/748
5,910,756 A * 6/1999 Ella ........................... 333/133
6,109,738 A * 8/2000 Miyata et al. ................ 347/71
6,131,256 A * 10/2000 Dydyk et al. .............. 29/25.35
6,143,976 A * 11/2000 Endros ....................... 136/256

OTHER PUBLICATIONS

Lang, W., "Silicon Microstructuring Technology", *Materials Science and Engineering*, R17, (1996), 1-55.

Ruby, Rich, "Micromachined Cellular Filters", *IEEE MTT-S Digest*, (1996), 1149-4452.

Stoller, A. I., "The Etching of Deep Vertical-Walled Patterns In Silicon", *RCA Review*, (Jun. 1970), 271-275.

\* cited by examiner

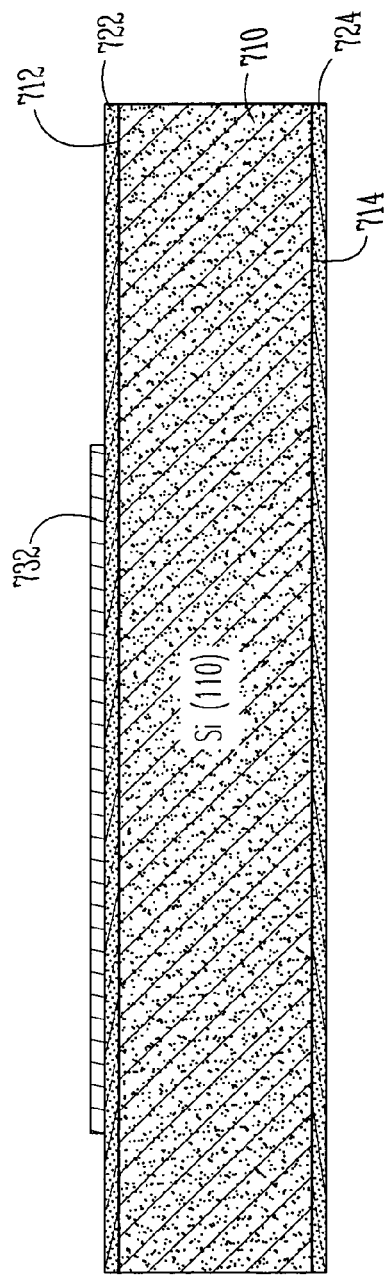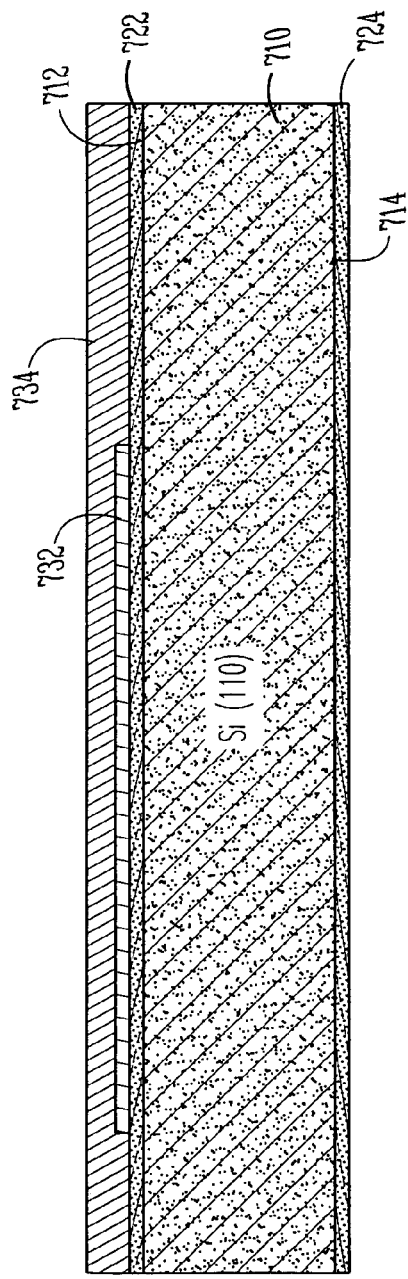

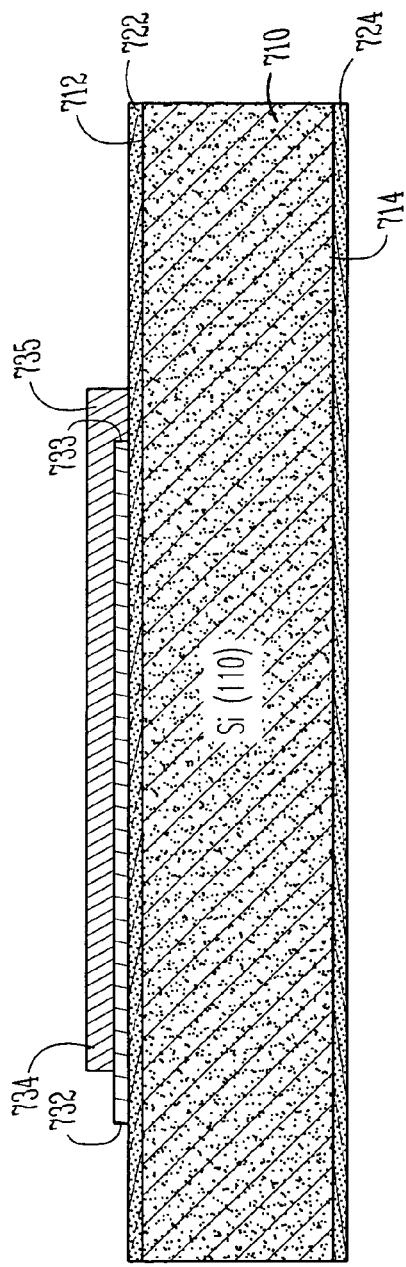
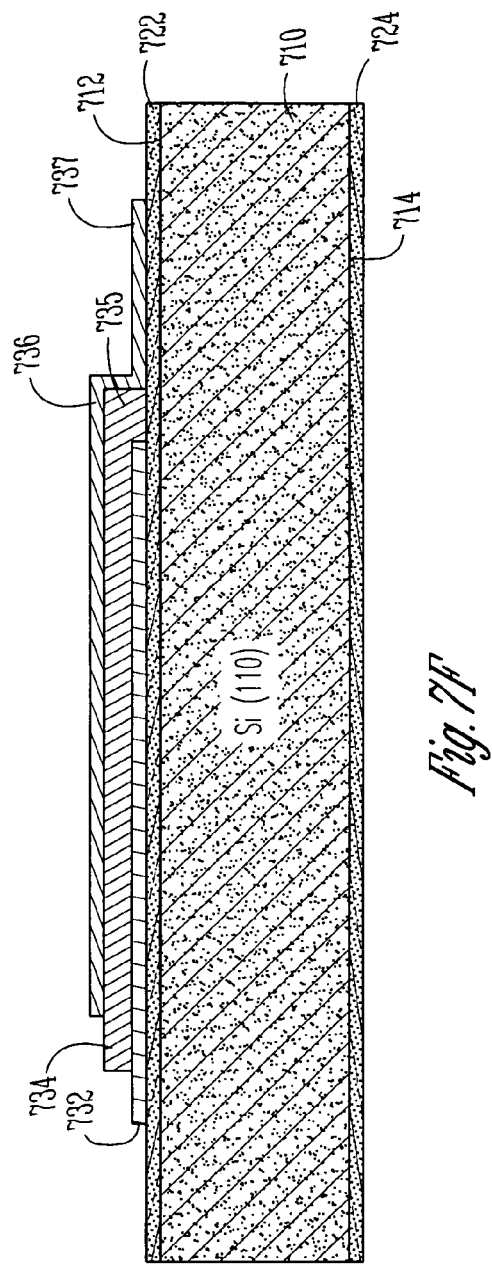

METHOD FOR FORMING BULK RESONATORS SILICON <110> SUBSTRATE

FIELD OF THE INVENTION

The present invention pertains to forming a film bulk acoustic resonator ("FBAR") structure. More specifically, the present invention relates to the methods of forming a structure for a film bulk acoustic resonator.

BACKGROUND OF THE INVENTION

In some instances it is desirable to provide a radio frequency front-end filter. In the past ceramic filters and SAW filters have been used as front-end radio frequency filters. There are problems with SAW filters in that such filters start to have excessive insertion loss above 2.4 gigahertz (GHz). Ceramic filters are large in size and can only be fabricated with increasing difficulty as the frequency increases.

A basic FBAR device 100 is schematically shown in FIG. 1. The FBAR device 100 is formed on the horizontal plane of a substrate 110. A first layer of metal 120 is placed on the substrate 110, and then a piezoelectric layer 130 is placed onto the metal layer 120. The piezoelectric layer can be ZnO, AlN, PZT, any other piezoelectric materials. A second layer of metal 122 is placed over the piezoelectric layer 130. The first metal layer 120 serves as a first electrode 120 and the second metal layer 122 serves as a second electrode 122. The first electrode 120, the piezoelectric layer 130, and the second electrode 122 form a stack 140. A portion of the substrate 110 behind or beneath the stack 140 is removed using back side bulk silicon etching. Most commonly, the back side bulk silicon etching can be done in one of two ways—either using deep trench reactive ion etching ("DRIE") or using a crystallographic-orientation-dependent etch ("CODE"), such as KOH, TMAH, and EDP.

The FBAR device shown in FIG. 1 is formed using DRIE. The resulting structure is a horizontally positioned piezoelectric layer 130 sandwiched between the first electrode 120 and the second electrode 122 positioned above an opening 150 in the substrate. The FBAR is a membrane device suspended over the opening 150 in a horizontal substrate. The sidewalls of the opening 150 are substantially perpendicular to the piezoelectric layer 130. There are problems associated with forming FBARs using DRIE. One of the main problems is that forming an FBAR using DRIE is not conducive to mass production. The DRIE process is a single-wafer process and the typical etch rate is 4 to 10 um/minute. The manufacturing throughput using DRIE is low since the process is conducted on only one wafer at a time and since the etch rate is low. This results in costly FBARs.

Another basic FBAR device 200 is schematically shown in FIG. 2. The FBAR device 200 is formed on the horizontal plane of a substrate 110 made from bulk (100) silicon wafers. A first layer of metal 120 is placed on the substrate 110, and then a piezoelectric layer 130 is placed onto the metal layer 120. The piezoelectric layer can be ZnO, AlN, PZT, or any other piezoelectric materials. A second layer of metal 122 is placed over the piezoelectric layer 130. The first metal layer 120 serves as a first electrode 120 and the second metal layer 122 serves as a second electrode 122. The first electrode 120, the piezoelectric layer 130, and the second electrode 122 form a stack 140. A portion of the substrate 110 behind or beneath the stack 140 is removed using back side bulk silicon etching using a CODE, such as KOH, TMAH, and EDP. Back side bulk silicon etching produces an opening 250 in the substrate 110. Etching using a CODE results in a sloped sidewalls, such as sloped sidewall 251 and sloped sidewall 252. Although using a CODE has a higher manufacturing throughput, the resulting sloped sidewalls, such as 251, 252 add to the amount of space needed to produce an FBAR device. In other words, the number of devices produced per wafer drops dramatically. For example, an FBAR that is 200 µm square (dimension L=200 µm) would have an extra 300 µm on each side (dimension S=300 µm) devoted to the sidewalls of the opening 250. The area on the substrate per FBAR device would be 640,000 square µm. The area of a wafer used with straight sidewalls would be 40,000 square µm. Thus the density of FBAR devices formed with CODE processes would be approximately $1/16^{th}$ the density of FBAR devices having sloped sidewalls 251, 252. The use of CODE processes would result in a higher throughput, but would drop the number of devices that could be formed on each wafer drastically.

Thus, there is need for an FBAR device and a method for producing an FBAR device that lends itself to high manufacturing throughput and also has high number of devices per wafer. There is also a need for a lower cost FBAR device. There is still a further need for an FBAR device that can be manufactured reliably. There is also a need for a method of fabricating an FBAR device having good, reliable performance characteristics.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

FIG. 7D illustrates a cross sectional view of the (110) silicon wafer after the piezoelectric material has been sputtered onto the patterned metal for the bottom electrode.

FIG. 7E illustrates a cross sectional view of the (110) silicon wafer after the piezoelectric material has been patterned.

FIG. 7F illustrates a cross sectional view of the (110) silicon wafer after metal for the top electrode has been sputtered and patterned.

FIG. 7G illustrates a cross sectional view of the (110) silicon wafer after an opening is formed in the low tensile stress material (SiN or $SiO_2$) material.

The description set out herein illustrates the various embodiments of the invention and such description is not intended to be construed as limiting in any manner.

DETAILED DESCRIPTION

Figure 3:
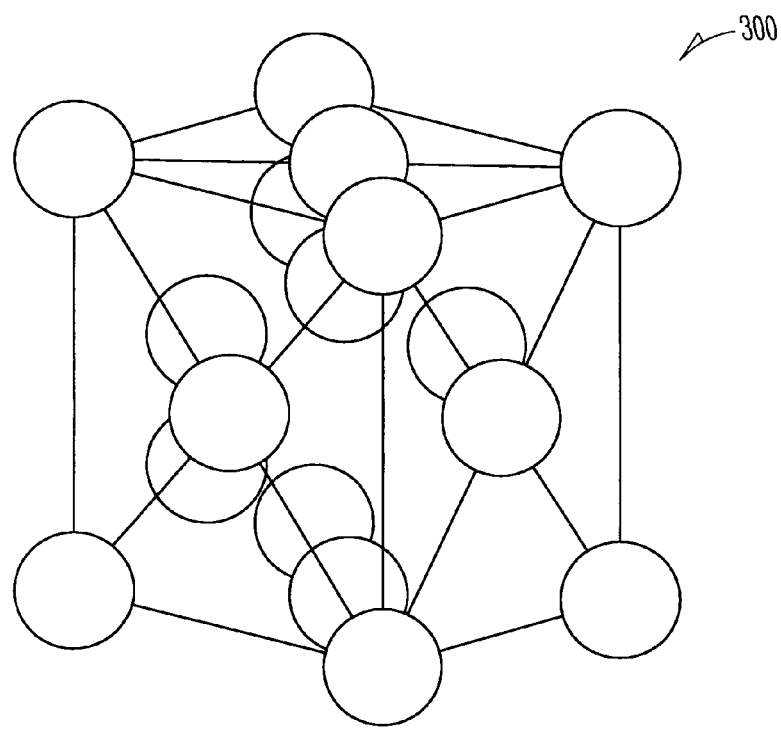
FIG. 3 illustrates a perspective view of a unit cell of silicon.

FIG. 3 illustrates a perspective view of a unit cell of silicon 300. The atoms in a crystal arrange themselves at specific points in a structure known as the unit cell. The unit cell is the first level of organization in a crystal. The unit cell structure is repeated everywhere in the crystal. FIG. 3 shows the unit cell for silicon. As shown in FIG. 3, the unit cell of silicon includes 16 atoms arranged in a diamond structure. When forming a film bulk acoustic resonator, a wafer of silicon is used as the base material. Wafers of silicon have a specific crystal orientation. The specific crystal orientation for the starting silicon wafer is designated. In other words, wafers can be cut from a crystal at different angles, with each angle representing a different plane. Each of these slices through the crystal would cut through each of the unit cells and, therefore, expose a specific plane within each cell. Each plane is unique differing in the number of atoms and binding energy between the atoms. These differences result in different chemical, electrical, and physical properties associated with each plane. The planes are identified by a series of numbers known as Miller Indices. The Miller Indices identify the location of a specific plane in the crystal. The layers of atoms or planes along which atoms are arranged in a particular crystal are known as the atomic or crystallographic planes. The relationship of a set of planes to the axis of a unit cell is designated by the Miller Indices.

Figure 4:
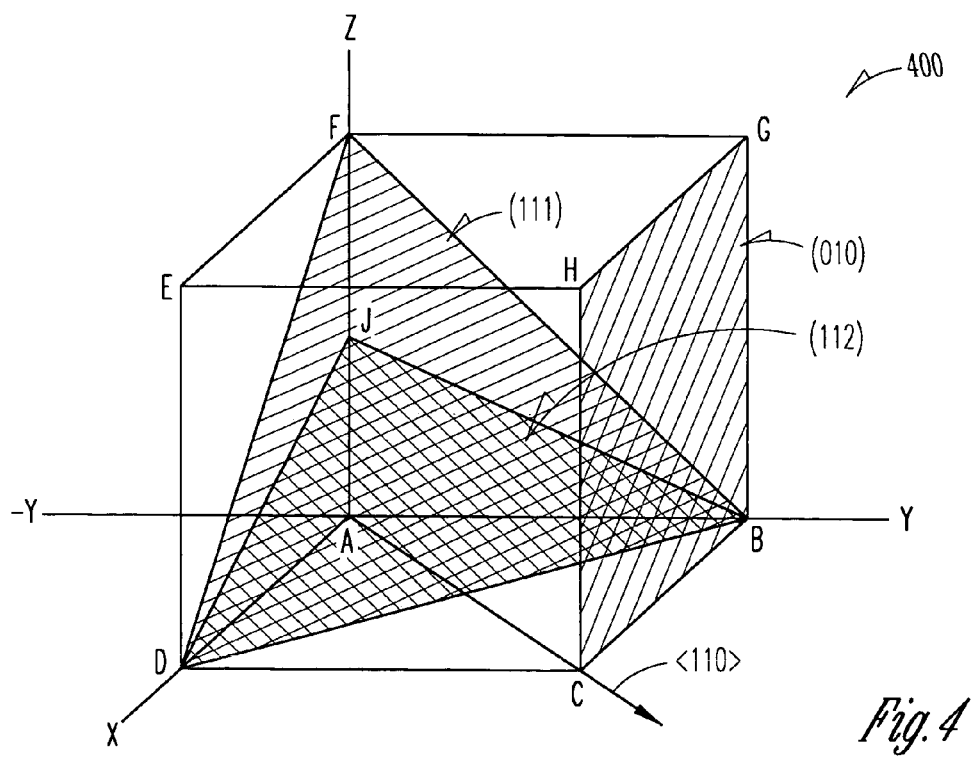
FIG. 4 illustrates the (101) plane, the (111) plane, and the (112) plane of the unit cell of silicon.

FIG. 4 shows a unit cell 400 having several planes shown thereon. One corner of the unit cell is assumed to be the origin of the space coordinates. Miller Indices identify any plane by the reciprocal of its intersections with these coordinates. If a plane is parallel to an axis, it intersects the axis at infinity. The unit cell 400 includes corners A, B, C, D, E, F, G, and H. The particular plane and the Miller Indices will be discussed using the letters designated on the unit cell 400. Point A of the unit cell 400 is the origin. The origin at point A has three axis, X, Y, and Z, which emanate from the origin. Axis X corresponds to the line defined by points A and D on the unit cell. The axis Y is defined by the points A and B on the unit cell 400. The Z axis is defined by the points A and F on the unit cell 400. The plane defined by points B, D, and F has a Miller Index of (111). The plane defined by B, D, F intersects the X axis one unit away from the origin, it intersects the Y axis one unit away from the origin, and it intersects the Z axis one unit away from the origin. The inverse of one equals one, therefore the Miller Index is equal to (111). The plane defined by letters B, C, H, and G only intersects the Y axis at one unit. The X and the Z axis are not intersected by this plane since it is parallel to both the X and Z axis. Therefore, the intersection points are infinity for X, 1 for Y, and infinity for Z. The inverse of these values is the Miller Indices associated with the plane B, C, H, G. Therefore, the Miller Index is (010) for the plane defined by letters, B, C, H and G. A third plane is shown and defined by the letters B, D, J. The X axis is intersected by the plane B, D, J one unit away from the origin, and Y axis is also intersected by the plane B, D, J one unit away from the origin. The Z axis is intersected one-half unit away from the origin. The reciprocal of these various intersection points yield the Miller Index of (112).

Figure 5:
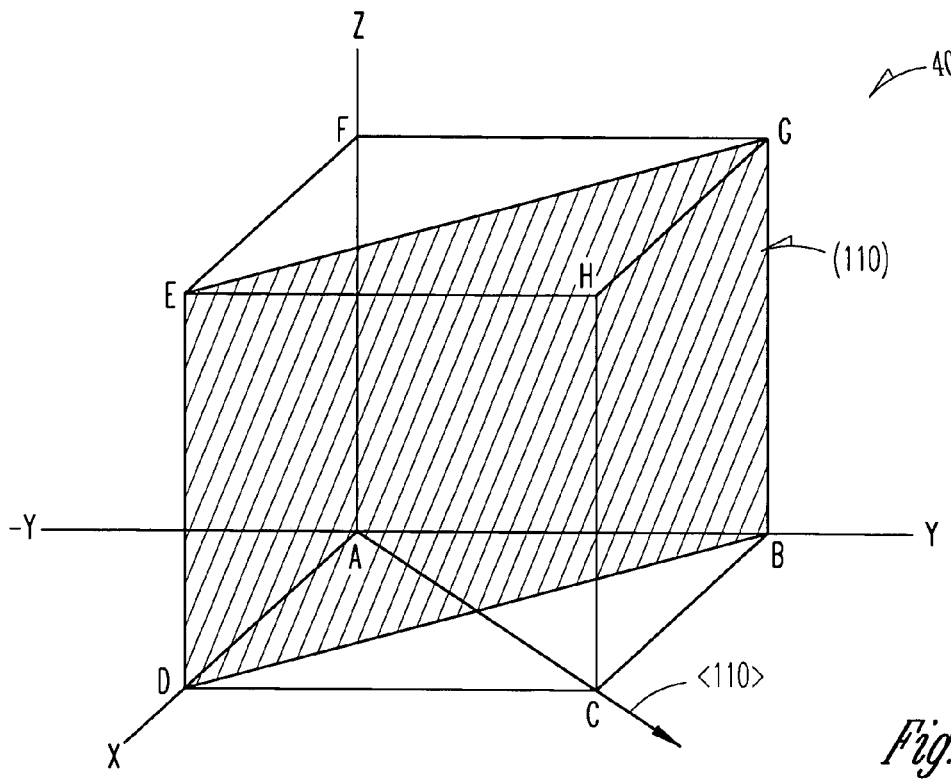
FIG. 5 illustrates the (110) plan and the <110> vector associated with the (110) plane.

FIG. 5 shows the same unit cell 400 which is defined by the letters A, B, C, D, E, F, G, and H. FIG. 5 shows the plane defined by the letters B, D, E, and G. This particular plane intersects the X axis at one unit, the Y axis at one unit, and does not intersect the Z axis or, in other words, intersects the Z axis at infinity. The inverse of the intersection points, therefore, results in a Miller Index of (110). The planes may also be designated by vectors which are perpendicular to the plane of interest. Therefore, the plane B, D, E, F, which has the Miller Indices of (110) can be also be designated by the vector passing through A and C, which carries a designation of <110>. Thus, a plane is designated with parenthesis while the vector perpendicular to the plane is designated by the Miller Index within brackets.

Figure 6:
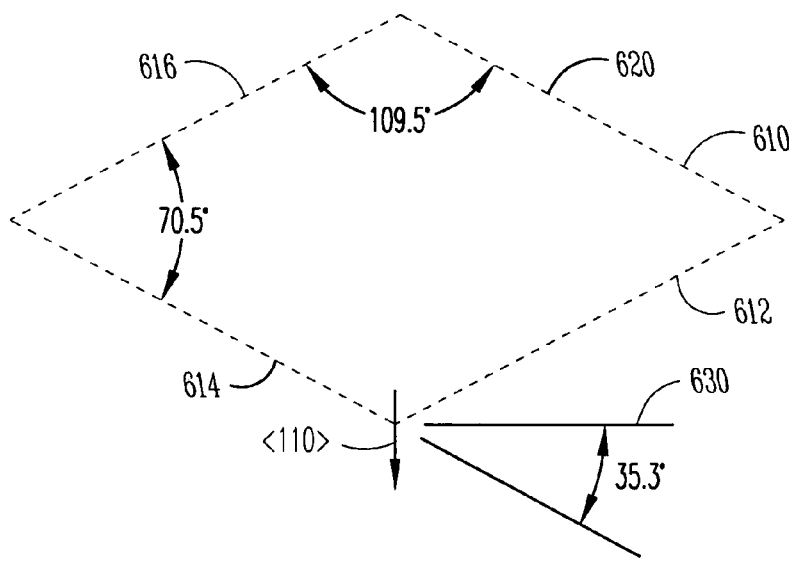
FIG. 6 illustrates the relationship between four (111) planes which are perpendicular to the (110) surface of the Si <110> wafer.

FIG. 6 illustrates the relationship between four (111) planes, which are perpendicular to the (110) plane or surface of a silicon <110> wafer. Four (111) planes are designated by the reference numbers 610, 612, 614, and 616. The four (111) planes are shown as dotted lines for a portion of the plane. The four (111) planes 610, 612, 614, 616 are perpendicular to the (110) plane, but are not perpendicular to one another. The four (111) planes 610, 612, 614, 616 form a rhombus with angles of 70.5 degrees and 109.5 degrees. It should be noted that the length of the sides of the rhombus 620, that is formed, is not limited to the length of the sides shown in FIG. 6. A rhombus could be formed having two very short sides, or having four very short sides (resulting in a very small rhombus). Two of the (111) planes have an angle of 35.25 degrees to the main flat of a silicon wafer. The main flat of the silicon wafer is designated by the reference numeral 630. As shown in FIG. 6, sides 614 and 612 of the rhombus 620 form an angle of 35.25 degrees to the main flat 630 of the wafer.

Figure 7A:
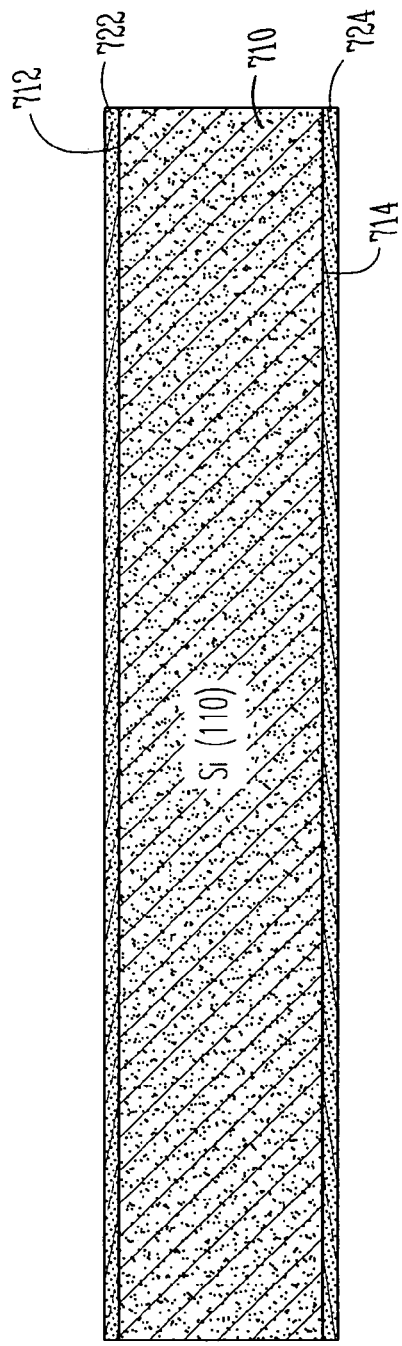
FIG. 7A illustrates a cross sectional view of a (110) silicon wafer after a low tensile stress material (SiN or SiO$_2$) has been deposited on the top and bottom of the wafer.

FIGS. 7A to 7I show various steps in the processing of the wafer to form an FBAR device of this invention. FIG. 7A illustrates a cross-sectional view of a (110) silicon wafer 710 having a first major surface 712 and a second major surface 714. A low tensile stress material 722 is deposited on the first major surface 712 of the wafer 710. Low tensile stress material 724 is deposited on the second major surface 714 of the wafer 710. As shown in FIG. 7A, the first major surface 712 corresponds to the top of the silicon wafer 710, while the second major surface 714 corresponds to the bottom major surface of the silicon wafer 710. It should be noted that the designation of "top" and "bottom" are merely to show the positional relation of the wafer in the figures and is not considered a limiting term for the purposes of claim interpretation.

Figure 7B:
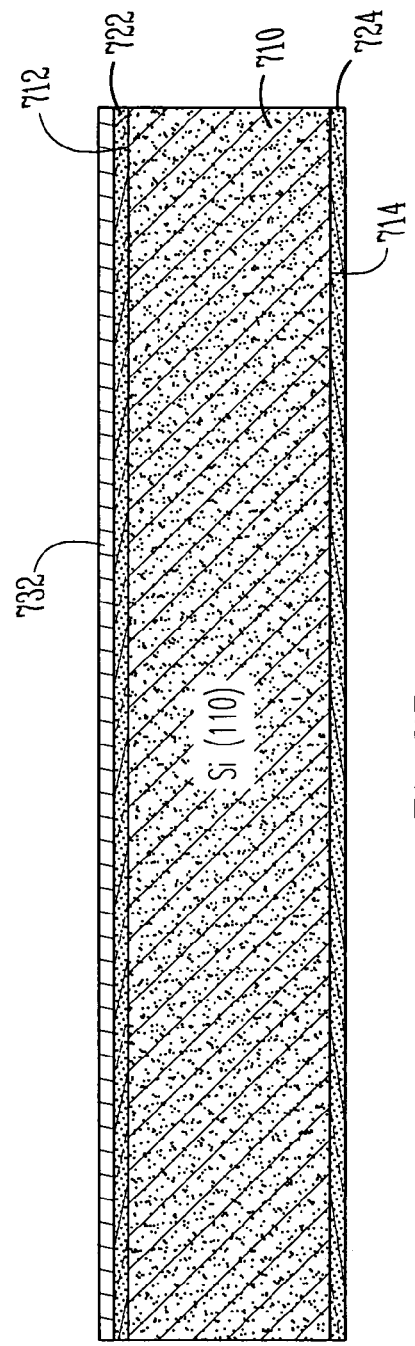
FIG. 7B illustrates a cross sectional view of the (110) silicon wafer after metal for the bottom electrode has been sputtered onto one of the major surfaces.

FIG. 7B illustrates a cross-sectional view of the (110) silicon wafer after a layer of metal 732 has been deposited on the first major surface 712 of the wafer 710. In actuality, the metal surface 732 is actually deposited on the layer 722 of low tensile stress material such as SiN or $SiO_2$. The deposited metal layer 732 will eventually become the bottom electrode of an FBAR, which is being formed. The metal layer 732 can be placed onto the low tensile stress metal layer 722 in a number of ways. In one embodiment, the metal layer 732 is sputtered onto the metal layer 722 associated with the first major surface 712 of the (110) substrate 710.

Figure 7C:
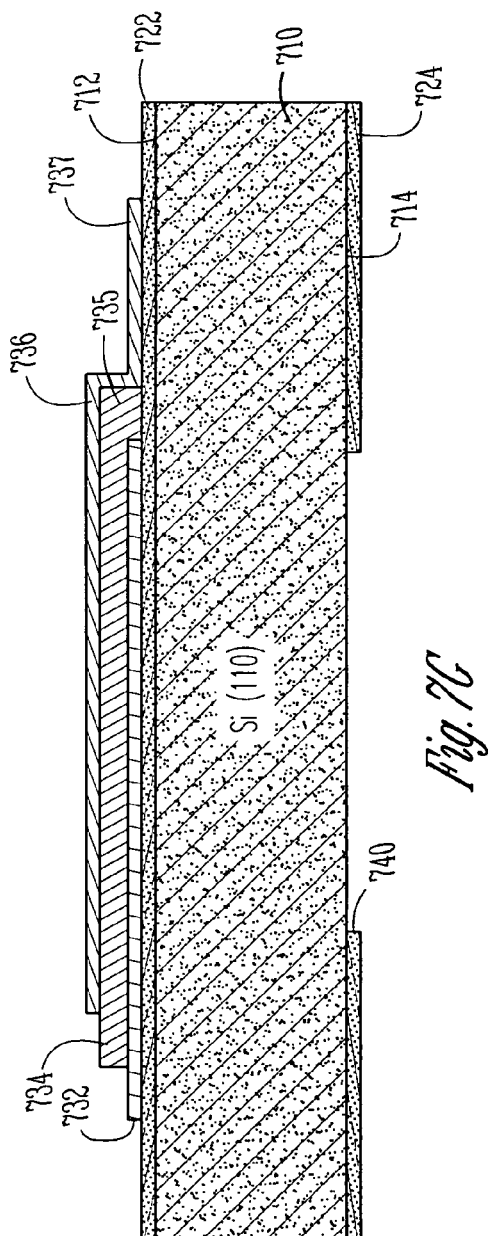
FIG. 7C illustrates a cross sectional view of the (110) silicon wafer after the metal for the bottom electrode has been patterned.

FIG. 7C illustrates a cross-sectional view of the (110) silicon wafer after the metal layer 732 is patterned. The metal layer 732 is patterned. In one embodiment the pattern is formed by placing a layer of photoresist on the metal layer 732, exposing the photoresist so that the selected or desired pattern of the metal layer 732 is formed on the metal layer 732 and then by etching the unwanted portion of the metal layer 732 away using any number of etch schemes. Once the unwanted portion of the metal layer 732 has been removed, the photoresist protecting the pattern portion 732 which remains is then removed. The result is that a pattern of metal 732 corresponding to the bottom electrode of an FBAR device remains on the metal layer 722 of the first major surface 712 of the Si (110) wafer 710. It should be noted that any pattern can be formed. Square patterns and rectangular patterns can be formed. In one embodiment of this invention, the pattern associated with the metal layer 732 is a rhombus. Different type of rhombuses having sides of different geometries can be used as the pattern associated with the patterned metal layer 732.

FIG. 7D illustrates a cross sectional view of the (110) silicon wafer after a piezoelectric material has been deposited upon the major surface 712 of the (110) silicon wafer 710. The piezoelectric material 734 can be deposited in any number of ways onto the metal layer 722 and the patterned metal layer 734. In one embodiment, the piezoelectric material 734 is sputtered onto the first major surface 712 of the (110) silicon wafer 710.

FIG. 7E illustrates a cross sectional view of the (110) silicon wafer 710 after the piezoelectric material 734 is patterned. The pattern associated with the piezoelectric layer 734 typically is bounded, for the most part, by the pattern formed on the metal layer 732, which eventually becomes the bottom electrode of the FBAR device. One end or edge 735 of the patterned piezoelectric material 734 passes over an edge 733 of the patterned metal layer 732.

FIG. 7F illustrates a cross sectional view of the (110) silicon wafer 710 after another metal layer 736 has been deposited and patterned on the metal layer 722 and on the layer of piezoelectric material 734. The metal layer 736 corresponds to the top electrode of the FBAR device. The top electrode 736 includes a portion for making electrical connection to the top electrode, which carries the reference numeral 737. The metal layer 736 can be placed or deposited onto the major surface 712 of the (110) wafer 710 in any number of ways. In one embodiment, the metal layer 736 and the electrical contact 737 are sputtered onto the first major surface 712 and onto the piezoelectric layer 734. Patterning the metal layer 736 and the electrical contact 737 is accomplished via photoresist masks and etching away the additional, unwanted or undesired metal previously deposited onto the major surface 712 of the (110) silicon wafer 710. It should be noted that the end 735 of the piezoelectric material 734 is necessary to isolate metal layer 732 from metal layer 736 of the FBAR device.

FIG. 7G illustrates a cross sectional view of the (110) silicon wafer 710 after an opening 740 is formed in the low tensile stress material layer 724 on the second major surface 714 of the Si (110) wafer 710.

Figure 7H:
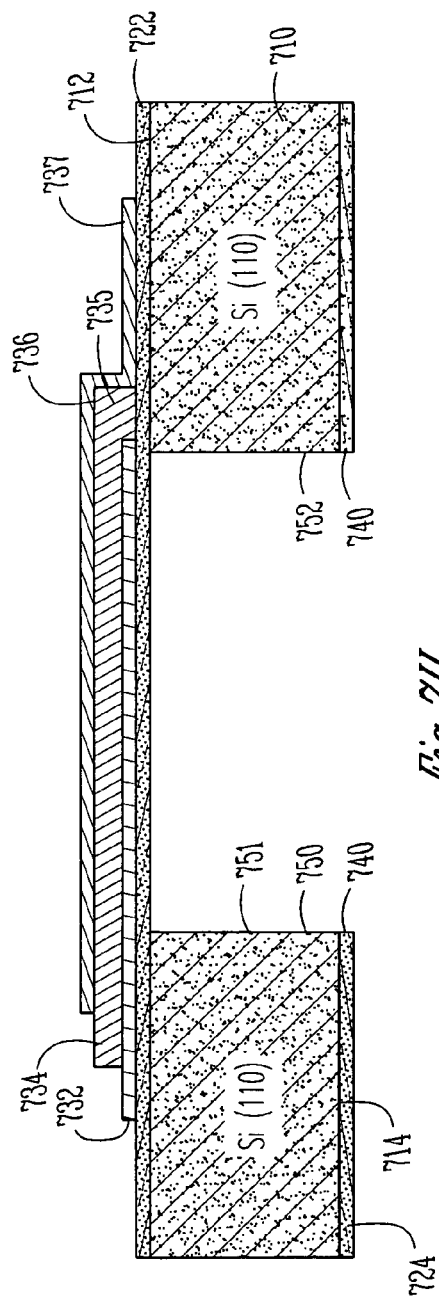
FIG. 7H illustrates a cross sectional view of the (110) silicon wafer after applying a crystal-orientation dependent etch.

FIG. 7H illustrates a cross sectional view of the (110) silicon wafer 710 after applying a crystal-orientation dependent etch ("CODE"). In one embodiment, the CODE process is performed using KOH. In another embodiment, EDP is used in the CODE process. Using either of these etchants results in a difference in the etch rate along the vector <110> and the vector <111> is in a ratio of 600:1. In other words, using a (110) silicon allows for using either the KOH or EDP etchant to form an opening 750 in the back side of the silicon (110) wafer 710. In other words, using a silicon (110) wafer allows for the use of an etchant, such as KOH or EDP, which has a much faster etch rate in the <110> direction, which is perpendicular to the surface of the silicon (110) on which the FBAR is formed. The etch rate in the <110> is very slow or 1/600th the rate of the etch in the <110> direction. The result is that vertical sidewalls can be obtained when silicon (110) wafers are used during fabrication of the FBAR. Although only one device is shown as being formed in FIGS. 7A to 7I, it should be noted that these devices are formed in bulk on a wafer surface. Once the various FBARs are formed on a wafer, the wafers are sliced and diced to form individual FBAR devices.

Figure 1:
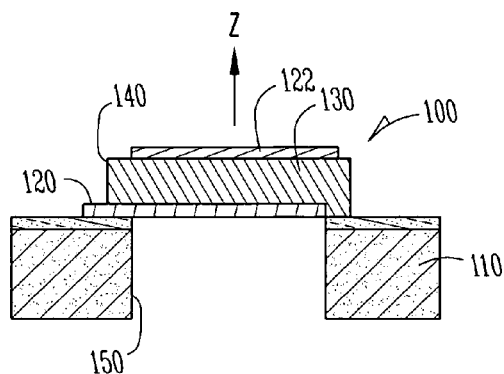
FIG. 1 illustrates a cross sectional view of a first prior art film bulk acoustic resonator.
Figure 2:
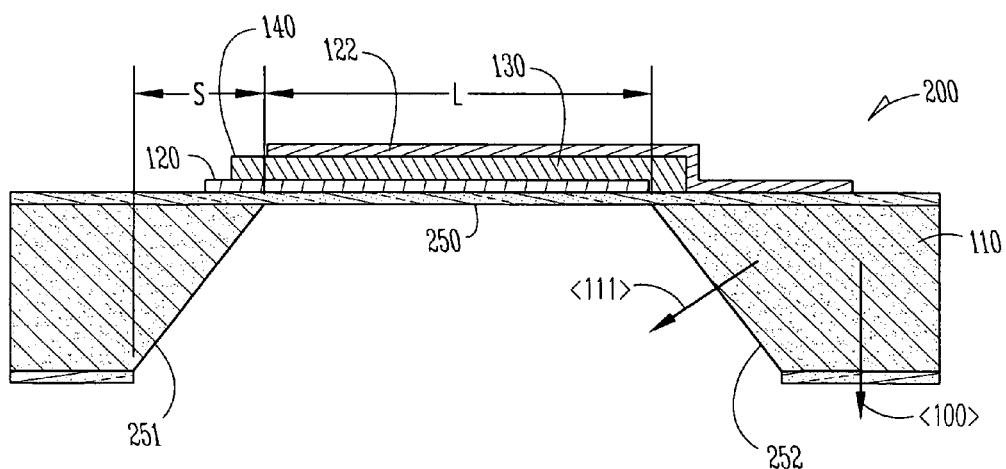
FIG. 2 illustrates a cross sectional view of a second prior art film bulk acoustic resonator.
Figure 7I:
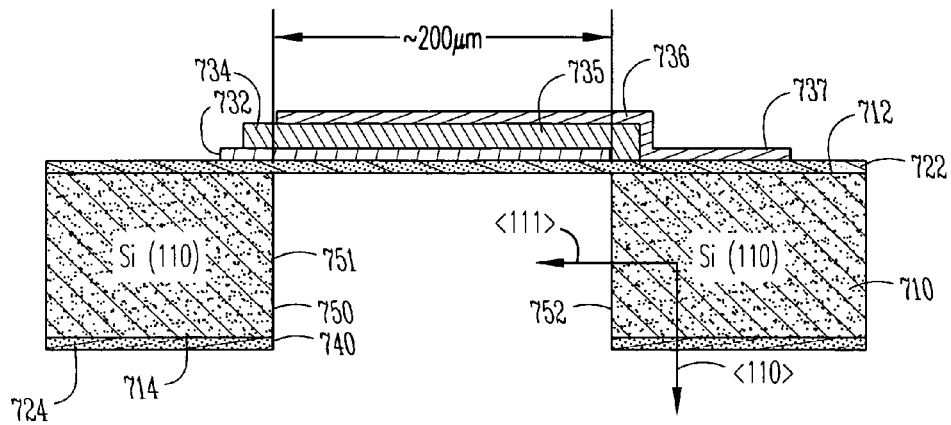
FIG. 7I illustrates the <110> vector associated with the (110) plane, and the <111> vector associated with the (111) plane of the unit cell of silicon.

FIG. 7I is also a device which is formed using a CODE process or a crystal-orientation dependent etchant, such as KOH or EDP. In this particular figure, the length of the opening carries a dimension of approximately 200 mm. It shown that the sidewalls 751 and 752 are vertical or substantially vertical. This produces a much higher yield when compared to the prior art process, the results of which are shown in FIG. 2. As shown in FIG. 2, the sidewalls 251 and 252 are sloped. For a device that would be approximately 200 mm square, the slope would substantially reduce the yield of the number of FBARs that could be formed on a particular wafer. As discussed in the background of the invention section, and specifically as discussed with respect to FIG. 2, the FBAR formed as shown in FIGS. 7H and 7I requires about 1/16th the surface area of the wafer and, therefore, many, many more or 16 times as many FBARs can be formed using the process discussed in which the wafer used is an Si (110) wafer and a CODE process is used to etch the back side of the wafer behind the device which will become an FBAR. FIG. 7I also shows are specifically lays out the vector <110> and the vector <111> direction.

Now turning to FIGS. 8A and 8B, a specific embodiment of the FBAR 801 as formed will be discussed. One characteristic of the use of a crystal-orientation dependent etchant is that it will etch in one direction, namely the <110> direction very quickly comparing to (111) planes. (<111> planes will still be etched, but just much slower) The end result of the back side etch using a crystal-orientation dependant etchant in combination with a (110) silicon wafer is that a rhombus-shaped opening is very easily formed. The rhombus-shaped opening is shown in FIGS. 8A and 8B as reference numeral 850.

Figure 8A:
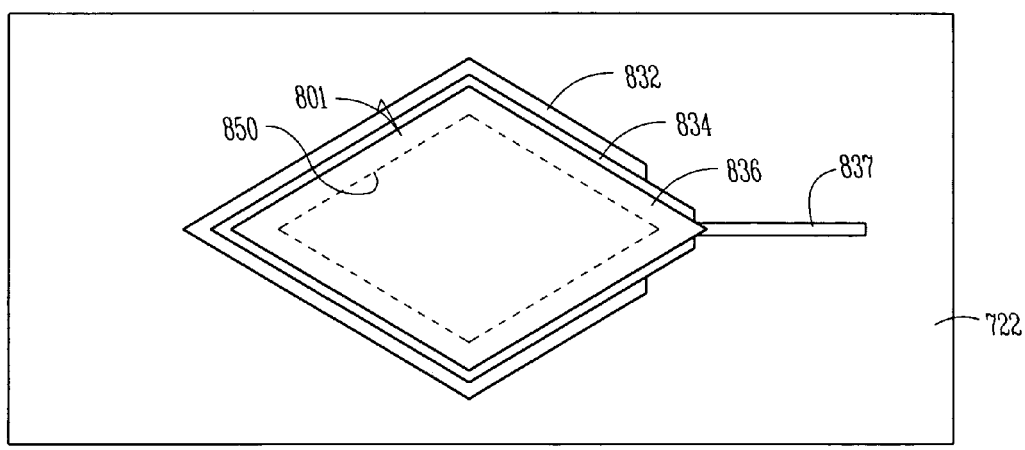
FIG. 8A illustrates a top view of an electrode covering the piezoelectric portion of a first embodiment of a film bulk acoustic resonator on the silicon substrate electrode thereon.
Figure 8B:
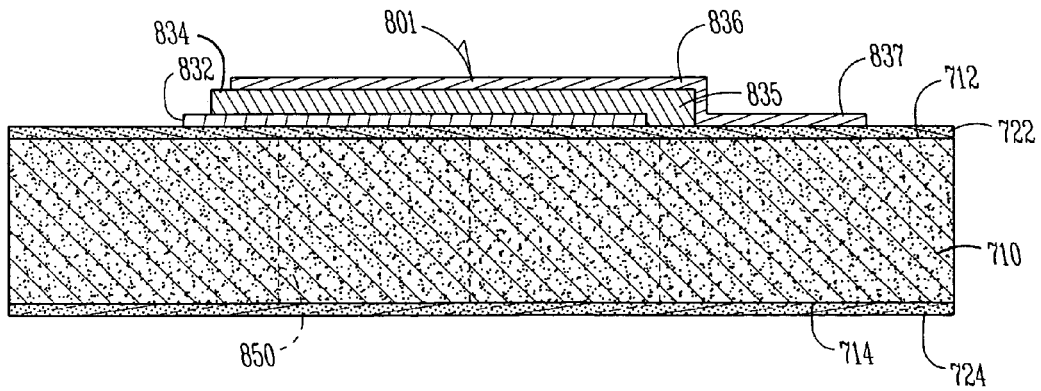
FIG. 8B illustrates an elevational view of a film bulk acoustic resonator made on <110> silicon by crystal-orientation-dependent-etching.

FIG. 8A illustrates a top view of an FBAR device 801, and FIG. 8B shows an elevational view of the FBAR device formed. The FBAR device includes a bottom electrode 832 and a top electrode 836 having an electrical contact end 837.

Sandwiched between the top electrode 836 and the bottom electrode 832 is a piezoelectric layer 834. The piezoelectric layer 834 includes an end 835 which isolates the bottom electrode 832 from the top electrode 836. The FBAR device sits on a (110) silicon substrate 710 having a first major surface 712 and a second major surface 714. Atop the major surface 712 is a low tensile stress metal layer 722, and deposited on the major surface 724 is a similar low tensile stress material 724. A crystal-orientation dependent etchant such as KOH or EDP is used to form a back side opening 850. The back side opening 850 is patterned so that it substantially corresponds to a rhombus-shaped opening which exposes or corresponds to the shape formed by the (111) planes as they meet the (110) surface of the silicon (110) wafer or substrate 710. The selective etchant then can be placed into an opening of the shape to form the opening 850.

Figure 9A:
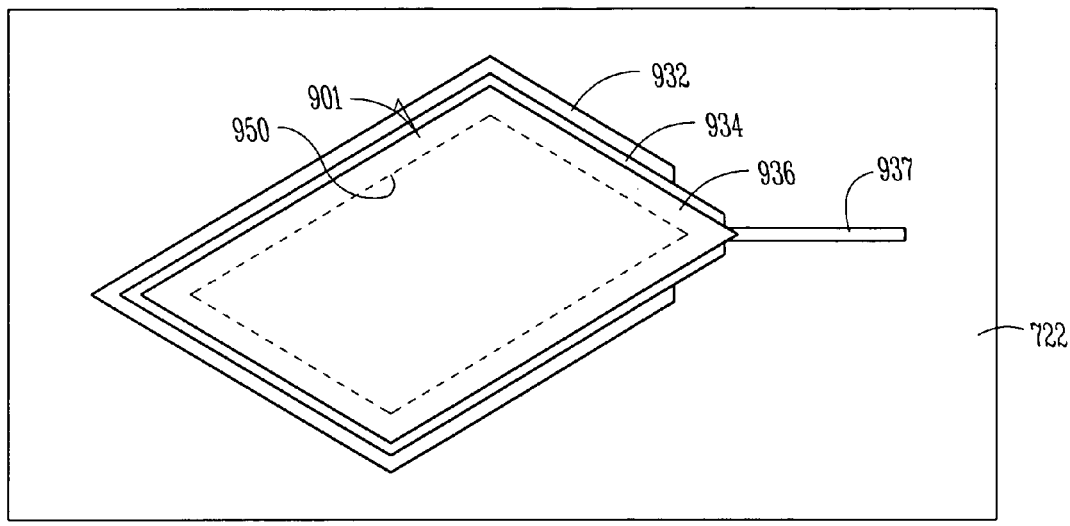
FIG. 9A illustrates a top view of an electrode covering the piezoelectric portion of a second embodiment of a film bulk acoustic resonator on the silicon substrate.
Figure 9B:
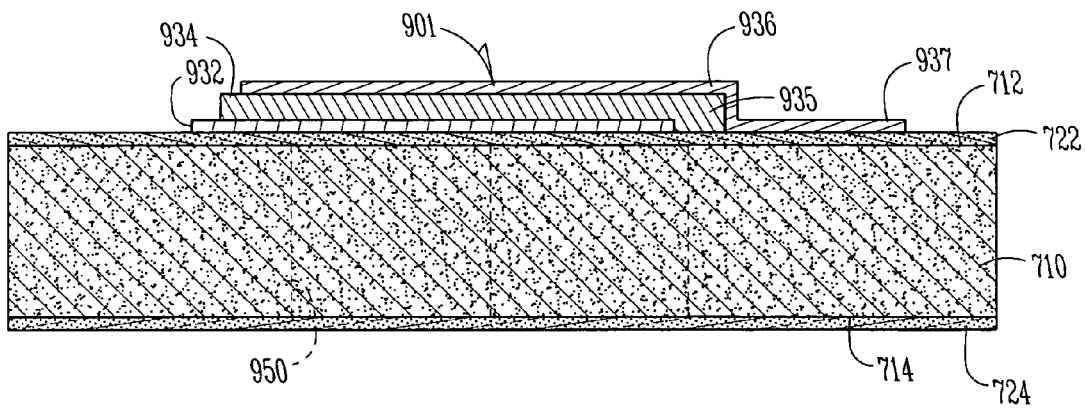
FIG. 9B illustrates an elevational view of a film bulk acoustic resonator made on <110> silicon by crystal-orientation-dependent-etching.

FIGS. 9A and 9B show another embodiment of an FBAR device made on (110) by crystal-orientation dependent etching. FIG. 9A illustrates a top view of an electrode associated with another embodiment of an FBAR device 901. One characteristic of the use of a crystal-orientation dependent etchant is that it will etch in one direction, namely the <110> direction very quickly and not go into the (111) planes. In other words, the etchant will not go in the <111> direction. The end result of the back side etch using a crystal-orientation dependant etchant in combination with a (110) silicon wafer is that a rhombus-shaped opening is very easily formed. The rhombus-shaped opening is shown in FIGS. 9A and 9B as reference numeral 950.

FIG. 9A illustrates a top view of an FBAR device 901, and FIG. 9B shows an elevational-view of the FBAR device formed. The FBAR device includes a bottom electrode 932 and a top electrode 936 having an electrical contact end 937. Sandwiched between the top electrode 936 and the bottom electrode 932 is a piezoelectric layer 934. The piezoelectric layer 934 includes an end 935 which isolates the bottom electrode 932 from the top electrode 936. The FBAR device sits on a (110) silicon substrate 710 having a first major surface 712 and a second major surface 714. Atop the major surface 712 is a low tensile stress metal layer 722, and deposited on the major surface 724 is a similar low tensile stress material 724. A crystal-orientation dependent etchant such as KOH or EDP is used to form a back side opening 950. The back side opening 950 is patterned so that it substantially corresponds to a rhombus-shaped opening which exposes or corresponds to the shape formed by the (111) planes, as they meet the (110) surface of the silicon (110) wafer or substrate 710. The selective etchant then can be placed into an opening of the shape to form the opening 950. The rhombus formed in FIGS. 9A and 9B can also be termed as a strip-like-shaped rhombus. A rhombus shaped such as in FIG. 8A and 9A has a possible disadvantage in that the high-order plane of the slow etch rate (111) plane may occur. As a result, the etch side walls in the corner areas of the back side opening 850 may not be vertical. Using the strip-shaped rhombus back side opening 950 shown in FIGS. 9A and 9B, the corner area is relatively smaller than the ones shown in FIGS. 8A and 8B. It should also be noted that any geometry of a rhombus can be used to form the FBAR device of this invention.

Figure 10:
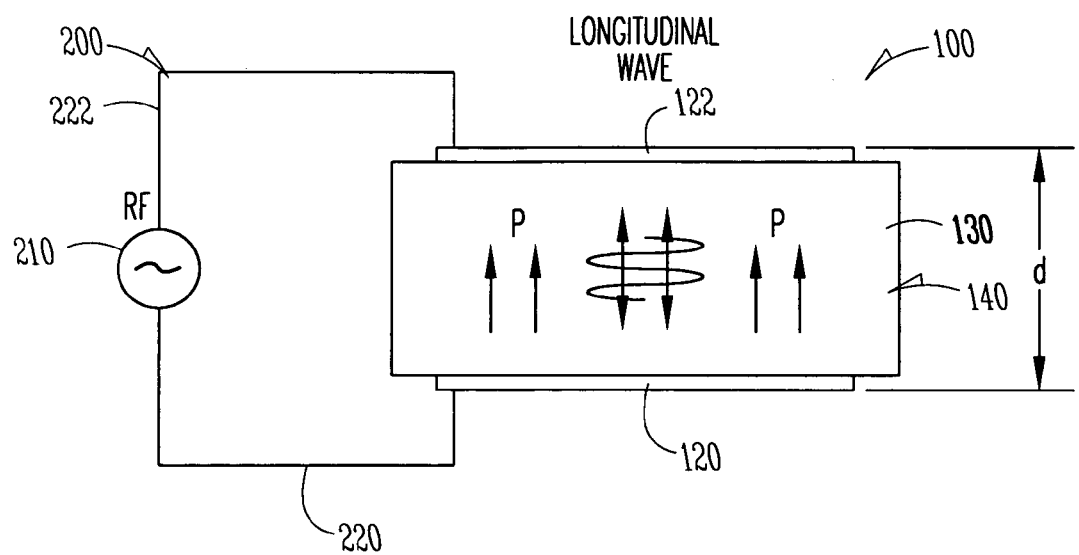
FIG. 10 illustrates a schematic of an electrical circuit of a film bulk acoustic resonator.

FIG. 10 illustrates the schematic of an electrical circuit 2000 which includes a film bulk acoustic resonator 100. The electrical circuit 2000 includes a source of radio frequency "RF" voltage 210. The source of RF voltage 210 is attached to the first electrode 120 via a first electrical conductor 220 and attached to the second electrode 122 by a second electrical conductor 222. The entire stack 140 can freely resonate in the Z direction "$d_{33}$" mode when the RF voltage at resonant frequency is applied. The resonant frequency is determined by the thickness of the membrane or the thickness of the piezoelectric layer 130 which is designated by the letter "d" or dimension "d" in FIG. 10. The resonant frequency is determined by the following formula:

$f_0 \sim V/2d$, where $f_0$=the resonant frequency,

V=acoustic velocity of piezoelectric layer, and d=the thickness of the piezoelectric layer.

It should be noted that the structure described in FIGS. 7A to 10 can be used as a resonator, which is a basic component for a filter. To form an FBAR, piezoelectric films, such as ZnO and AlN, are used as the active materials. The material properties of these films, such as the longitudinal piezoelectric coefficient and acoustic loss coefficient, are key parameters for the resonator's performance. Key performance factors include Q-factors, insertion loss, and the electrical/mechanical coupling.

CONCLUSION

A film bulk acoustic resonator formed on a substrate includes a layer of piezoelectric material having a first major surface, and a second major surface. The film bulk acoustic resonator also has a first conductive layer including a portion in contact with the first major surface of the layer of piezoelectric material, and a second conductive layer in contact with the second surface of the layer of piezoelectric material. At least a portion of the piezoelectric material is sandwiched between the first conductive layer and the second conductive layer. The substrate on which the film bulk acoustic resonator is formed has an opening therein which exposes the first conductive layer. The opening is substantially in the shape of a parallelogram. The parallelogram includes a first pair of parallel sides and a second pair of parallel sides. The first pair of parallel sides makes an angle other than 90 degrees with the second pair of parallel sides. The film bulk acoustic resonator also has the first conductive layer, and the second conductive layer formed substantially in the shape of a parallelogram. The layer of piezoelectric material can also be in substantially in the shape of a parallelogram. In some embodiments, the parallelogram is substantially in the shape of a rhombus.

The substantially parallelogram shaped opening in the substrate has a first sidewall and a second sidewall. The angle between the first sidewall of the substantially parallelogram shaped opening and the second sidewall of the substantially parallelogram shaped opening is in the range of approximately 67 degrees to 74 degrees. In some embodiments, the angle between the first sidewall and the second sidewall is approximately 70.5 degrees. The substrate is <110> silicon. In some embodiments, the substrate, which includes the parallelogram-shaped opening and the device, is also in the shape of a parallelogram. The first sidewall of the substantially parallelogram shaped opening and the second sidewall of the substantially parallelogram shaped opening are substantially perpendicular to a major surface of the substrate. The first sidewall and the second sidewall of the substantially parallelogram shaped opening is also substantially perpendicular to a major surface of the piezoelectric layer. Also disclosed is a method for forming a device on a substrate of <110> silicon. The method includes forming a first conductive layer on the substrate, forming a piezoelectric layer on the first portion of a first conductive layer, and forming a second electrode on the piezoelectric layer.

The method also includes removing a backside portion of the substrate under the piezoelectric layer and the first conductive layer using a crystal orientated dependent etch. Forming the first conductive layer onto the substrate includes forming the first conductive layer substantially as a parallelogram. The parallelogram includes two sides which make an angle to one another in the range of approximately 67 degrees to 74 degrees. The piezoelectric layer is also formed substantially as a parallelogram. The substantially parallelogram shaped piezoelectric layer includes two sides which make an angle to one another in the range of approximately 67 degrees to 74 degrees. In some embodiments, the piezoelectric layer is formed substantially as a rhombus. The second conductive layer onto the substrate can also be formed substantially as a parallelogram. The second conductive layer formed substantially as a parallelogram includes two sides which make an angle to one another in the range of approximately 67 degrees to 74 degrees. Removing a backside portion of the substrate also includes forming an opening having sidewalls which are substantially perpendicular to the first conductive layer of the device, or forming an opening having sidewalls which are substantially perpendicular to the first or second major surface of the substrate. Removing a backside portion of the substrate also includes masking the major backside surface of the substrate in the form of a parallelogram, and applying the crystal orientated dependent etch until the first conductive layer is reached. In one embodiment, the parallelogram is formed having a first set of sidewalls which are longer than the second set of sidewalls. In some embodiments, the parallelogram formed has a first set of sidewalls which are at least twice as long as the second set of sidewalls. The crystal orientated dependent etch can be potassium hydroxide (KOH) or ethylene diamine pyrocatechol (EDP).

Also disclosed is a method for forming a plurality of devices on a substrate of <110> silicon. The method includes applying a first conductive layer onto the substrate, applying a piezoelectric layer on the first portion of a first conductive layer, and applying a second electrode on the piezoelectric layer. The first conductive layer, the piezoelectric layer and the second electrode are formed into a plurality of parallelogram-shaped devices. The backside portion of the substrate under a plurality of the devices is formed on the substrate substantially simultaneously using a crystal orientated dependent etch. The removal of the backside portion of the substrate includes forming a mask having a plurality of parallelogram-shaped openings therein which are positioned below the first conductive layer of a plurality of devices. The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for forming a device on a substrate of <110> silicon comprising:
   forming a first conductive layer onto the substrate;
   forming a piezoelectric layer on the first portion of a first conductive layer;
   forming a second electrode on the piezoelectric layer; and
   removing a backside portion of the substrate under the piezoelectric layer and the first conductive layer using a crystal orientated dependent etch, wherein forming the first conductive layer onto the substrate includes forming the first conductive layer substantially as a parallelogram having a first pair of parallel sides and a second pair of parallel sides, the first pair of parallel sides making an angle other than 90 degrees with the second pair of parallel sides.

2. The method for forming a device on a substrate of <110> silicon of claim 1 wherein forming the first conductive layer onto the substrate includes forming the first conductive layer substantially as a parallelogram which includes two sides which make an angle to one another in the range of approximately 67 degrees to 74 degrees.

3. The method for forming a device on a substrate of <110> silicon of claim 1 wherein forming the piezoelectric layer onto the substrate includes forming the piezoelectric layer substantially as a parallelogram having a first pair of parallel sides and a second pair of parallel sides, the first pair of parallel sides making an angle other than 90 degrees with the second pair of parallel sides.

4. The method for forming a device on a substrate of <110> silicon of claim 1 wherein forming the piezoelectric layer onto the substrate includes forming the piezoelectric layer substantially as a parallelogram which includes two sides which make an angle to one another in the range of approximately 67 degrees to 74 degrees.

5. The method for forming a device on a substrate of <110> silicon of claim 1 wherein forming the piezoelectric layer onto the substrate includes forming the piezoelectric layer substantially as a rhombus.

6. The method for forming a device on a substrate of <110> silicon of claim 1 wherein forming the second conductive layer onto the substrate includes forming the second conductive layer substantially as a parallelogram having a first pair of parallel sides and a second pair of parallel sides, the first pair of parallel sides making an angle other than 90 degrees with the second pair of parallel sides.

7. The method for forming a device on a substrate of <110> silicon of claim 1 wherein forming the second conductive layer onto the substrate includes forming the second conductive layer substantially as a parallelogram which includes two sides which make an angle to one another in the range of approximately 67 degrees to 74 degrees.

8. The method for forming a device on a substrate of <110> silicon of claim 1 wherein removing a backside portion of the substrate includes forming an opening having sidewalls which are substantially perpendicular to the first conductive layer of the device.

9. The method for forming a device on a substrate of <110> silicon of claim 1 wherein removing a backside portion of the substrate includes forming an opening having sidewalls which are substantially perpendicular to the first or second major surface of the substrate.

10. The method for forming a device on a substrate of <110> silicon of claim 1 wherein removing a backside portion of the substrate includes: masking the major backside surface of the substrate in the form of a parallelogram; and applying the crystal orientated dependent etch until the first conductive layer is reached.

11. The method for forming a device on a substrate of <110> silicon of claim 10 wherein the parallelogram is formed having a first set of sidewalls which are at least twice as long as the second set of sidewalls.

12. The method for forming a device on a substrate of <110> silicon of claim 10 wherein the crystal orientated dependent etch is potassium hydroxide (KOH).

13. The method for forming a device on a substrate of <110> silicon of claim 10 wherein the parallelogram is formed having a first set of sidewalls which are longer than the second set of sidewalls.

14. The method for forming a device on a substrate of <110> silicon of claim 10 wherein the crystal orientated dependent etch is ethylene diamine pyrocatechol (EDP).

15. A method for forming a plurality of devices on a substrate of <110> silicon comprising:
   applying a first conductive layer onto the substrate;
   applying a piezoelectric layer on the first portion of a first conductive layer;
   applying a second electrode on the piezoelectric layer;
   forming the first conductive layer, the piezoelectric layer and the second electrode into a plurality of parallelogram-shaped devices; and
   removing a backside portion of the substrate under a plurality of the devices formed on the substrate substantially simultaneously using a crystal orientated dependent etch, wherein the backside portion is substantially parallelogram-shaped.

16. A method for forming a plurality of devices on a substrate of <110> silicon comprising:
   applying a first conductive layer onto the substrate;
   applying a piezoelectric layer on the first portion of a first conductive layer;
   applying a second electrode on the piezoelectric layer;
   forming the first conductive layer, the piezoelectric layer and the second electrode into a plurality of parallelogram-shaped devices; and
   removing a backside portion of the substrate under a plurality of the devices formed on the substrate substantially simultaneously using a crystal orientated dependent etch, wherein removing the backside portion of the substrate includes forming a mask having a plurality of parallelogram-shaped openings therein which are positioned below the first conductive layer of a plurality of devices.

17. A method for forming a plurality of devices on a substrate of <110> silicon comprising:
   applying a first conductive layer onto the substrate;
   applying a piezoelectric layer on the first portion of a first conductive layer;
   applying a second electrode on the piezoelectric layer;
   forming the first conductive layer, the piezoelectric layer and the second electrode into a plurality of parallelogram-shaped devices; and
   removing a backside portion of the substrate under a plurality of the devices formed on the substrate substantially simultaneously using a crystal orientated dependent etch, wherein removing the backside portion of the substrate includes forming a mask having a plurality of parallelogram-shaped openings therein.

18. A method for forming a plurality of devices on a substrate of <110> silicon comprising:
   applying a first conductive layer onto the substrate;
   applying a piezoelectric layer on the first portion of a first conductive layer;
   applying a second electrode on the piezoelectric layer;
   forming the first conductive layer, the piezoelectric layer and the second electrode into a plurality of parallelogram-shaped devices, wherein the parallelogram is parallelogram has a first pair of parallel sides and a second pair of parallel sides, the first pair of parallel sides making an angle other than 90 degrees with the second pair of parallel sides; and
   removing a backside portion of the substrate under a plurality of the devices formed on the substrate substantially simultaneously using a crystal orientated dependent etch.

* * * * *

UNITED STATES PATENT AND TRADEMARK OFFICE
CERTIFICATE OF CORRECTION

| | | |
|---|---|---|
| PATENT NO. | : 7,152,289 B2 | Page 1 of 1 |
| APPLICATION NO. | : 10/254402 | |
| DATED | : December 26, 2006 | |
| INVENTOR(S) | : Wang et al. | |

It is certified that error appears in the above-identified patent and that said Letters Patent is hereby corrected as shown below:

On the title page, item (54), in column 1, lines 1-2, delete "METHOD FOR FORMING BULK RESONATORS SILICON <110> SUBSTRATE" and insert -- METHOD FOR FORMING A FILM BULK ACOUSTIC RESONATOR ON A SILICON <110> WAFER SUBSTRATE --, therefor.

In column 1, lines 1-2, delete "METHOD FOR FORMING BULK RESONATORS SILICON <110> SUBSTRATE" and insert -- METHOD FOR FORMING A FILM BULK ACOUSTIC RESONATOR ON A SILICON <110> WAFER SUBSTRATE --, therefor.

Signed and Sealed this

First Day of July, 2008

JON W. DUDAS
*Director of the United States Patent and Trademark Office*